United States Patent
Gouin et al.

(10) Patent No.: US 7,263,011 B2
(45) Date of Patent: Aug. 28, 2007

(54) MEMORY CIRCUIT WITH FLEXIBLE BITLINE-RELATED AND/OR WORDLINE-RELATED DEFECT MEMORY CELL SUBSTITUTION

(75) Inventors: Vincent Gouin, Mandelieu (FR); Linda Hirel, Biot (FR); Luc Palau, Antibes (FR)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/246,046

(22) Filed: Oct. 7, 2005

(65) Prior Publication Data

US 2006/0087895 A1 Apr. 27, 2006

(30) Foreign Application Priority Data

Oct. 7, 2004 (EP) .................................. 04023959

(51) Int. Cl.
*G11C 7/00* (2006.01)
(52) U.S. Cl. .............. 365/200; 365/189.02; 365/189.07
(58) Field of Classification Search ................ 356/200, 356/189.02, 189.07; 365/200, 189.02, 189.07, 365/230.03
See application file for complete search history.

(56) References Cited

U.S. PATENT DOCUMENTS

| 4,376,300 | A | 3/1983 | Tsang |
| 4,601,031 | A | 7/1986 | Walker et al. |
| 5,416,740 | A | 5/1995 | Fujita et al. |
| 5,504,712 | A | 4/1996 | Conan |
| 5,644,541 | A | 7/1997 | Siu et al. |
| 5,793,683 | A | 8/1998 | Evans |
| 6,484,271 | B1 | 11/2002 | Gray |
| 6,542,418 | B2 * | 4/2003 | Braceras et al. ............ 365/200 |
| 6,909,645 | B2 * | 6/2005 | Eilert ........................ 365/200 |
| 7,023,747 | B2 * | 4/2006 | Takahashi ................... 365/200 |

FOREIGN PATENT DOCUMENTS

WO WO92/08231 5/1992

* cited by examiner

*Primary Examiner*—David Lam
(74) *Attorney, Agent, or Firm*—Patterson & Sheridan, L.L.P.

(57) ABSTRACT

The inventive memory circuit comprises a main memory block and a substitution memory block for substitution of defect memory cells, with the substitution memory block being external to the main memory block. The substitution memory block is arranged to substitute at least one bitline-related or wordline-related set of memory cells being connected to the same bitline or wordline, respectively. Furthermore, the inventive memory circuit comprises redirection means for redirecting the access to a memory cell of the at least one respective substituted set of memory cells to the substitution memory block.

40 Claims, 5 Drawing Sheets

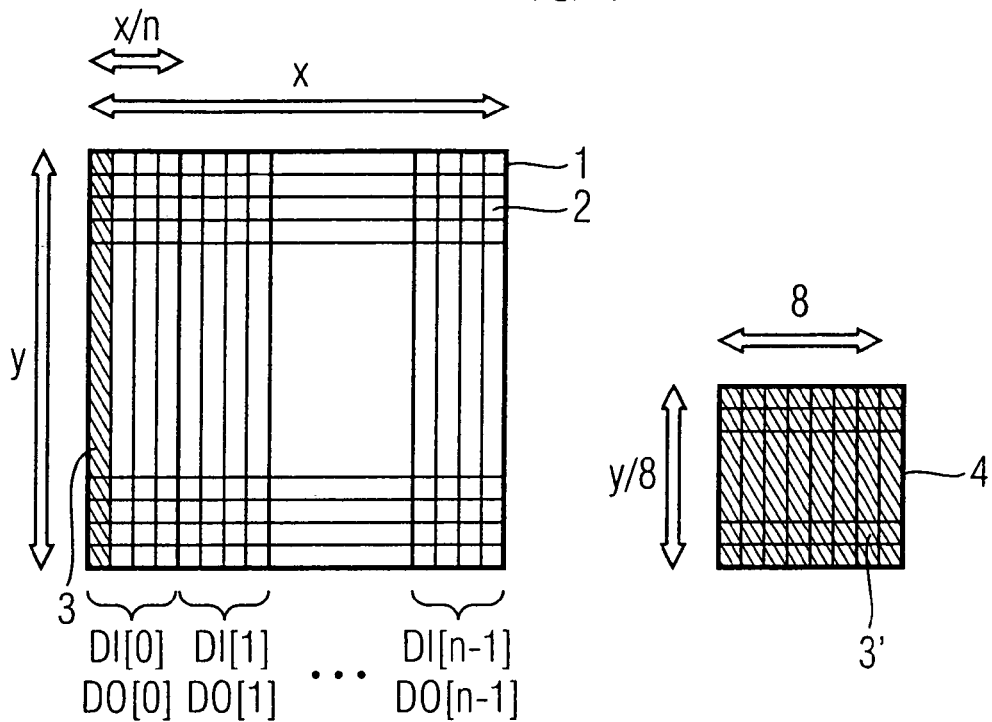
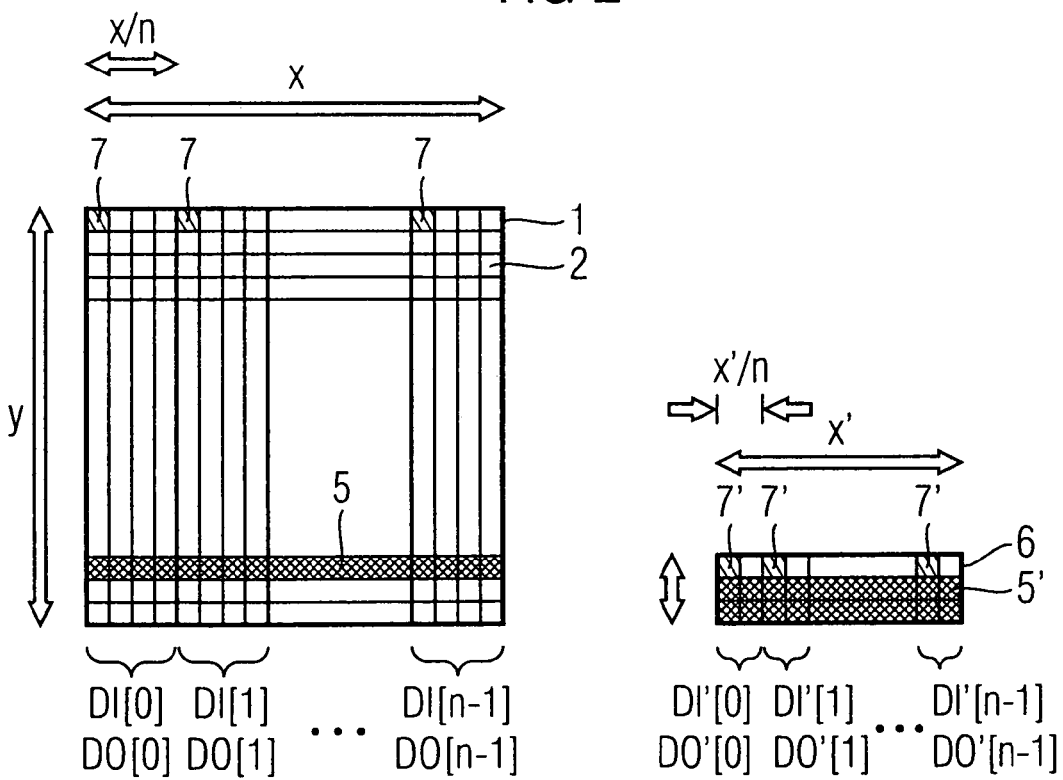

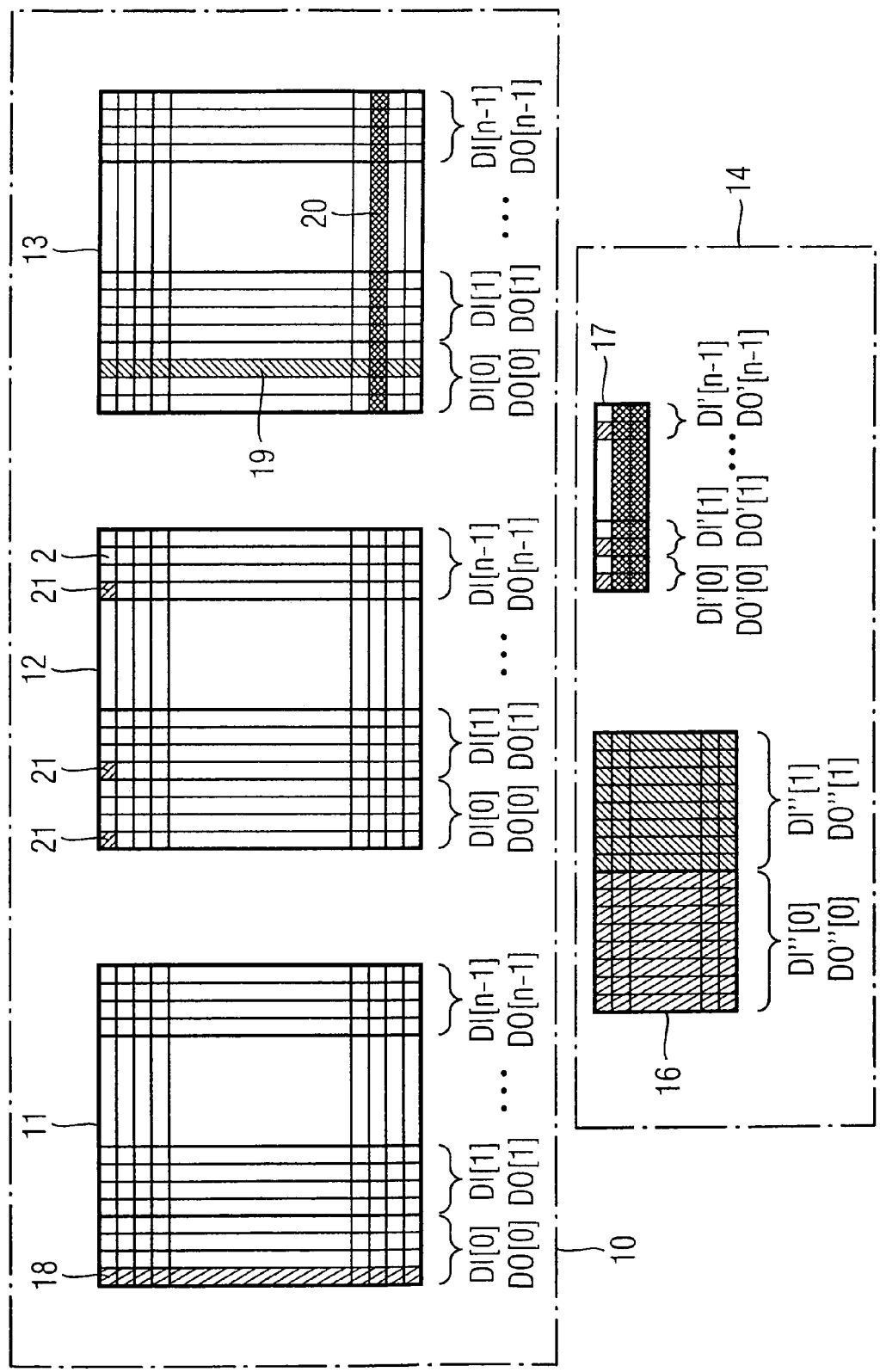

| FIG 5A | FIG 5B |

MEMORY CIRCUIT WITH FLEXIBLE BITLINE-RELATED AND/OR WORDLINE-RELATED DEFECT MEMORY CELL SUBSTITUTION

CROSS-REFERENCE TO RELATED APPLICATIONS

This application claims foreign priority benefits under 35 U.S.C. §119 to co-pending German patent application number EP 04 023 959.2, filed 7 Oct. 2004. This related patent application is herein incorporated by reference in its entirety.

BACKGROUND OF THE INVENTION

1. Field of the Invention

The invention relates to memory circuits, particularly to RAM (random access memory) circuits, with memory redundancy for the substitution of defect memory cells.

2. Description of the Related Art

RAM circuits comprise one or more two-dimensional arrays of 1-bit-memory cells. In DRAM (dynamic random access memory) circuits the information storage in a memory cell is based on the charge state of a capacitor, whereas in SRAM (static random access memory) circuits flip-flops with positive feedback for information storage are employed.

The memory cells of one array are arranged into y rows and x columns. The memory cells of one row are assigned to one wordline, whereas the memory cells of one column are assigned to one bitline. The memory cells are selected via the signals on the wordlines; for the actual data access, i.e. reading and writing of the data, the bitlines are employed.

Generally, RAM circuits are accessed word-oriented via an appropriate address signal, i.e. each code of the address signal is assigned to a specific number of n memory cells within one memory array which are read out or written in parallel. The n-bit-wide information is equivalent to one word. Consequently, such RAM circuits comprise n-bit-wide inputs and outputs with n ports. In this case, to each port of the n ports a plurality of x/n bitlines is assigned, with one bitline per port being selectable via port-related column multiplexers.

For word-oriented memory access a multi-bit-wide address signal is applied to the RAM circuit, which generally exhibits three code components. A first code component, typically Id(y)-bit-wide, specifies the wordline of the accessed memory cells. A second code component, typically Id(x/n)-bit-wide, specifies one bitline for each plurality of x/n grouped bitlines. The optional third code component specifies the index of the memory array in case more than one memory array is employed.

RAM circuits may contain one or more randomly distributed defective memory cells after fabrication. Without appropriate countermeasures such RAM circuits with defect memory cells would be unusable for most applications even if only a small number of memory cells compared to the total number is affected. Generally, the larger the number of memory cells within one memory array, the lower the probability that the array is fault-free.

To prevent most RAM memories from being discarded once one or more defect memory cells are located during memory test, substitution memory cells are provided which allow a substitution of such defective memory cells within the main memory. Normally, the address codes or subsets thereof of the substituted memory cells are stored in non-volatile memory cells, which are generally implemented by fuses. If a memory cell is accessed the stored address information is compared with the actual address information of the address signal. In case of a positive comparison result the access is redirected to the substitution memory cells.

For the substitution of defect memory cells, different approaches are conceivable.

1. Bitline-related Repair Approach

According to the so called bitline-related repair approach a complete bitline-related set of y memory cells being connected to the same bitline in one memory array is substituted with y substitution memory cells. In case a substituted bitline-related set comprises y=512 memory cells, all 512 memory cells are substituted.

2. Wordline-related Repair Approach

In case a wordline-related repair approach is employed, a complete word-line-related set of x memory cells being connected to the same wordline in one memory array is substituted by the same number of substitution memory cells. Similar to the bitline-related repair approach all memory cells connected to one wordline (e.g. 512 memory cells) are substituted.

3. Word-related Repair Approach

By applying a word-related repair approach, a word-related set of n memory cells which are addressed by one single address code is substituted by the same number of substitution memory cells.

4. Port-related or I/O-related Repair Approach

The port-related repair approach (also called I/O repair) is an extension of the bitline-related repair approach, i.e. more than one bitline is substituted. According to a port-related repair approach those x/n*y memory cells which are connected to a plurality of x/n bitlines, with the x/n bitlines being assigned to one port, i.e. connected to one column multiplexer, are substituted by the same number of substitution memory cells.

Generally, the bitline-related repair approach and the wordline-related repair approach are alternatively employed.

Regarding the implementation of the bitline-related repair approach or alternatively the wordline-related repair approach, additional bitlines or additional wordlines, respectively, which are connected to substitution memory cells are provided. Thus, the main memory and the substitution memory form a common array of main memory cells and substitution memory cells.

Consequently, the memory cells of the main memory and the substitution memory are typically identical. Thus, process failures affecting the yield of the memory cells of the main memory affect the yield of the substitution memory cells in the same way.

A further drawback of such an implementation of the bitline-related repair approach or alternatively the wordline-related repair is that the memory access time of the RAM circuit is increased in comparison to the memory access time of a RAM circuit without bitline-related or wordline-related substitution memory. This is due to the fact that earlier to the actual memory access the above-mentioned comparison regarding stored address information is performed.

In case the RAM circuit comprises more than one memory array, additional bitlines or wordlines which are connected to substitution memory cells, appropriate comparators and fuses for non-volatile address information storage are needed for each memory array. This leads to a large area over-head.

In addition, the concrete implementation of the bitline-related or wordline-related repair approach is only valid for a particular implementation of the main memory.

The document U.S. Pat. No. 6,484,271 B1 describes a memory system with redundancy for the substitution of defective memory cells within a main memory. The main memory comprises a plurality of memory instances. An extra substitution or redundant memory is provided which substitutes defective memory cells within the main memory, with the substitution memory being capable to substitute word-related sets of memory cells. The substitution memory is not capable to substitute complete wordline-related sets of memory cells or bitline-related sets of memory cells.

In the document U.S. Pat. No. 5,644,541 a memory system with redundancy for the substitution of defective memory cells within a plurality of DRAM memory circuits is presented. Similar to the document U.S. Pat. No. 6,484,271 B1 an extra substitution memory is provided, which substitutes defective memory cells within the plurality of DRAM memory circuits. The substitution memory substitutes single defective memory cells within the plurality of DRAM memory circuits. Complete wordline-related or bitline-related sets of memory cells within the plurality of DRAM memory circuits are not substi-tuted.

SUMMARY OF THE INVENTION

It is an object of the present invention to provide a memory circuit, particularly a RAM circuit, with memory redundancy for bitline-related or word-line related substitution of defect memory cells which overcomes the above-mentioned drawbacks.

The inventive memory (e.g. RAM) circuit for read and write access according to at least one embodiment comprises a main memory block, which comprises at least one complete memory array of memory cells. The memory cells are connected to wordlines as well as bitlines and are addressable via an address signal.

In addition, the memory circuit comprises a substitution memory block with at least one data input and at least one data output for the substitution of memory cells within the main memory block. The substitution memory block comprises a plurality of substitution memory cells. A substantial feature of the present inventive memory circuit is that the substitution memory block is external to the main memory block, i.e. the substitution memory block is spatially separated from the main memory block. Thus, the substitution memory cells and the memory cells of the main memory block do not form a memory array. In case the substitution memory block comprises at least one complete memory array of memory cells being connected to wordlines and bitlines, the bitlines within the main memory and within the substitution memory block are distinct nets. Also, the wordlines within the main memory and within the substitution memory block are distinct nets.

The substitution memory block is arranged to substitute at least one bitline-related set of memory cells being connected to the same bitline in one memory array. Thus, a bitline-related repair approach, as mentioned above, is employed.

Furthermore, the inventive memory circuit comprises redirection means for redirecting the access to a memory cell of the at least one respective substituted bitline-related set of memory cells in the main memory block to the substitution memory block.

The inventive external bitline-related repair approach provides the advantage that the physical implementation of the substitution memory block is not bound to the physical implementation of the main memory block. Advantageously, the substitution memory cells within the substitution memory block are less densely packed compared to the memory cells within the main memory block.

A further advantage of the memory circuit is that the processing speed of the circuit is generally not affected by the memory redundancy since the comparison can be performed in parallel to the main memory access.

In addition, the inventive solution provides the option that the substitution memory block can be shared for the substitution of several memory arrays within the main memory block. Thus, the total area overhead due to memory redundancy is reduced.

Furthermore, the external substitution memory is not bound to one specific main memory block and thus can be flexibly used for different designs of the main memory block.

In addition, the number of non-volatile memory cells for the address information storage is not dependent on the total number of memory array within the main memory.

It should be noted that the inventive memory circuit is not limited to a RAM circuit; the scope of the invention also comprises other types of memory circuits with read/write functionality, e.g., flash-memory circuits. Theoretically, the inventive memory circuit could be even a read-only memory circuit, i.e. without data inputs.

Advantageously, the redirection means comprises a first multiplexer for write access. The input of the first multiplexer is electrically connected to receive the signal on the data input of the memory circuit and the output of the first multiplexer is electrically connected to the data input of the substitution memory block.

According to a preferred embodiment, the redirection means comprises a second multiplexer for read access. The input of the second multiplexer is electrically connected to receive the signal on the data output of the substitution memory block and the signal on the data output of the main memory block. The output of the second multiplexer is electrically connected to the data output of the memory circuit.

It should be noted that the presence of the second multiplexer does not necessarily imply that the redirection means comprise the first multiplexer.

Advantageously, the data input and the data output of the memory circuit as well as the data input and the data output of the main memory block are each n-bit-wide. Thus, these data inputs and data outputs each comprise n ports, with n>1.

As mentioned above the n-bit-wide information at the data inputs or data outputs is equivalent to one word.

According to a preferred embodiment, the at least one data input and the at least one data output of the substitution memory block are each 1-bit-wide.

It should be noted that the substitution memory block may comprise not only one data input and one data output but more than one data input and data output (which is equivalent to a multi-bit-wide input or output). Nevertheless, such memory block comprises still at least one 1-bit-wide data input and at least one 1-bit-wide data output.

In case the data input of the memory circuit and the main memory block are each n-bit-wide and the at least one data input of the substitution memory block is 1-bit-wide, the first multiplexer is an n-to-1-multiplexer, i.e. with n binary input signals and 1 binary output signal, and the second multiplexer is an (n+1)-to-n-multiplexer, i.e. with n+1 binary input signals and n binary output signals.

For write access, the first multiplexer selects-one port of the n-bit-wide data input of the memory circuit, with the selected port being related to a currently addressed defective memory cell. The selected port is connected to the at least one 1-bit-wide data input of the substitution memory block via the first multiplexer, thereby writing the data which is dedicated to the defective memory cell into the substitution memory block.

For read access, the second multiplexer replaces the signal of one port of the n-bit-wide data output of the main memory block with the signal of one 1-bit-wide data output of the substitution memory block. This particular port is related to a currently addressed defective memory cell. The signals on the other ports of the data output of the main memory block are fed-through to the output of the memory circuit.

Advantageously, the redirection means comprise memory means, particularly fuses, for storing at least one first code specifying the at least one respective substituted bitline-related set of memory cells. In this case the redirection means further comprise a first comparator, which compares the at least one stored first code (related to a substituted bitline-related set of memory cells) with a code being derived from the current address signal. Therefore, the first comparator checks if the current address of the address signal is related to a substituted memory cell.

In this case, the substitution memory block advantageously comprises a particular input (called chip-select input) which enables the substitution memory block. The chip-select input is driven by the output of the first comparator. Optionally, logic gates are placed between the output of the first comparator and the chip-select input.

If the at least one stored first code is equal to the code which is derived from the current address signal, the substitution memory block is enabled via the chip-select input. Otherwise the substitution memory block is disabled.

Advantageously, within each memory array, to each port of the data input and/or data output of the main memory block a plurality of bitline-related sets of memory cells is assigned. Particularly, to each port of the n ports a plurality of x/n bitline-related sets of memory cells (if x is the number of bitlines of one memory array) is assigned. The at least one first code specifies one bitline-related set of memory cells within each plurality of bitline-related sets of memory cells. In this case, the first code is advantageously ld(x/n)-bit-wide.

According to a preferred embodiment, the main memory block comprises a plurality of complete memory arrays. In this case, the substitution memory block can be shared for the substitution of defective memory cells within several memory arrays.

If the main memory block comprises a plurality of memory arrays, the at least first code advantageously specifies the particular memory array, wherein the at least one respective substituted bitline-related set of memory cells is located.

According to a preferred embodiment, the redirection means comprise memory means, typically fuses, for storing a second code. The second code specifies the port-index of any above-specified n-bit-wide data input and/or output which is related to the at least one respective substituted bitline-related set of memory cells. Particularly, the second code is ld(n)-bit-wide.

In case such second code is provided, the redirection means advantageously comprise a decoder for decoding the second code to a select signal which controls any above-specified multiplexer. Since the two multiplexers select one port out of n ports (first multiplexer) or n ports out of n+1 ports (second multiplexer), the select signal is advantageously an n-bit-wide signal, with only the signal port corresponding to the substituted bitline-related set of memory cells being active.

Advantageously, the substitution memory block is arranged to substitute not only one bitline-related set of memory cells but a plurality m of bitline-related sets of memory cells; particularly, the substitution memory block comprises m 1-bit-wide data inputs and m 1-bit-wide data outputs. In this case, the memory means for storing the first code are arranged to store m first codes of m substituted bitline-related sets of memory cells.

Advantageously, the redirection means comprise m first comparators, which compare the m stored first codes with a code being derived from the current address signal. Alternatively, the redirection means comprise one comparator, which is comparing each first stored code one after the other with a code being derived from the current address signal. Additionally, memory means for storing a plurality of m second codes are to be pro-vided.

According to a preferred embodiment, the substitution memory block is arranged to substitute not only one bitline-related set but at least one port-related set of memory cells within one memory array. The at least one port-related set of memory cells comprises those bitline-related sets of memory cells within one memory array which are assigned to the same port of the data input and data output of the main memory block. The redirection means are arranged to redirect the access to a memory cell of the at least one substituted port-related set of memory cells to the sub-stitution memory block.

Thus, the substitution memory block and the redirection means support the above-mentioned port-related repair (I/O repair) approach. The above-mentioned advantages of the inventive external bitline-related repair approach are also valid for the inventive external port-related repair approach.

In case a port-related repair approach is employed, the redirection means advantageously comprise memory means for storing at least one third (which does not necessarily imply the presence of a first and second code) code which specifies the at least one respective substituted port-related set of memory cells. Furthermore, the redirection means comprise a second (which does not necessarily imply the presence of a first comparator) comparator which compares the at least one stored third code with a code being derived from the address signal.

The third code and the second comparator correspond to the above-mentioned first code and first comparator, respectively, of the bitline-related approach.

Further preferred embodiments of the port-related repair approach which are analogous to the above-mentioned preferred embodiments of the bitline-related repair approach are described in the dependent claims 16 to 18.

With respect to a second aspect of the invention, the inventive memory (e.g. RAM) circuit according to claim 20 employs a wordline-related repair approach.

The memory circuit comprises a main memory block, which comprises at least one complete memory array of memory cells connected to wordlines and bitlines. The memory cells are addressable via an address signal.

In addition, the memory circuit comprises a substitution memory block for the substitution of memory cells within the main memory block. The substitution memory block comprises a plurality of substitution memory cells. A substantial feature of the present inventive memory circuit is that the substitution memory block is external to the main memory block, i.e. the substitution memory block is spatially separated from the main memory block. Thus, the substitution memory cells and the memory cells of the main memory block do not form a memory array. The substitution memory block is arranged to substitute at least one wordline-related set of memory cells being connected to the same wordline in the at least one memory array. Thus, a wordline-related repair approach, as mentioned above, is employed.

Furthermore, the inventive memory circuit comprises redirection means for redirecting the access to a memory cell of the at least one respective substituted wordline-related set of memory cells in the main memory block to the substitution memory block.

The above-mentioned advantages of the memory circuit according to the inventive external bitline-related repair approach are also valid for the memory circuit according to the inventive external wordline-related re-pair approach.

Also with respect to the second aspect of the invention, it should be noted that the inventive memory circuit is not limited to a RAM circuit; the scope of the invention also comprises other types of memory circuits with read/write functionality, e.g. flash-memory circuits. Theoretically, the inventive memory circuit could be even a read-only memory circuit, i.e. without data inputs.

According to a preferred embodiment of the second aspect of the invention, the redirection means comprise a multiplexer for read access. The multiplexer is used to select either the signal on the output of the main memory block or the signal on the substitution memory block. The input of the multiplexer is electrically connected to receive the signal on the data output of the substitution memory block and the signal on the data output of the main memory block. The output of the multiplexer is electrically connected to the data output of the memory circuit.

Advantageously, the data input and the data output of the memory circuit, the data input and the data output of the main memory block as well as the data input and the data output of the substitution memory are each n-bit-wide. Thus, these data inputs and data outputs each comprise n ports, with n>1.

As mentioned above the n-bit-wide information at the data inputs or data outputs is equivalent to one word.

In case the data outputs of the memory circuit, the main memory block and the substitution memory block are each n-bit-wide, the multiplexer is advantageously implemented as a 2n-to-n-multiplexer, which either selects the signal on the data output of the main memory block or the substitution memory block.

Advantageously, the redirection means comprise memory means for storing at least one code specifying the at least one respective substituted wordline-related set of memory cells, i.e. more than one code is conceivable to specify more than one wordline-related set of memory cells. In this case, the redirection means further comprise a first comparator, which compares the at least one stored code with a code which is derived from the current address signal.

Thus, the first comparator checks if the current code of the address signal is related to a substituted memory cell.

In this case, the substitution memory block advantageously comprises a chip-select input which enables the substitution memory block. The chip-select input is driven by the output of the first comparator. Optionally, logic gates are placed between the output of the first comparator and the chip-select input.

If the at least one stored code is equal to the code which is derived from the current address signal, the substitution memory block is enabled via the chip-select input. Otherwise the substitution memory block is disabled.

Since the substitution memory block comprises the chip-select input no particular multiplexer at the data input of the memory circuit for selecting either the data input of the main memory block or the data input of the substitution memory block is necessary. Only in case that the stored code is equal to the code which is derived from the current address signal, the data at the input of the memory circuit is written to the enabled substitution memory block.

According to a preferred embodiment, the redirection means comprise an address generator. The address generator drives an address input of the substitution memory block. It further receives a code which is derived from the current address signal.

Because the substitution memory block has a substantially smaller memory capacity than the main memory block, the addressing of the substitution memory block and the main memory block is completely different, i.e. the number of addresses of the substitution memory block is significantly smaller than the number of addresses of the main memory block. The address generator, which can be also regarded as an address converter, receives the current address signal or a subset of the current address signal of the memory circuit to generate an appropriate address signal for the substitution memory block.

In case an address generator is provided, the address generator is advantageously configurable with respect to the structure of the main memory block, e.g. with respect to the total number of bitlines within one memory array of the main memory block which are related to one port of the main memory block. By providing a configurable address generator the external substitution memory is not bound to a specific main memory block and thus can be flexibly used for different designs of the main memory block.

Advantageously, the address generator receives a configuration signal which specifies the total number of bitlines within one memory array of the main memory block which are related to one port of the main memory block.

According to a preferred embodiment of the second aspect of the invention, the substitution memory block is arranged to substitute at least one word-related set of memory cells in the main memory. The word-related set of memory cells is addressed by one address code of the address signal. Thus, the inventive memory circuit further, i.e. beside the word-line-related repair approach, supports a word-related repair approach.

Consequently, the redirection means are also arranged to redirect the access to a memory cell of the at least one respective substituted word-related set of memory cells in the main memory block to the substitution memory block.

In case a word-related repair approach is supported, the redirection means advantageously comprise memory means for storing at least one address code of the at least one respective substituted word-related set of memory cells. The redirection means further comprise a second comparator, which compares the at least one stored address code with the code of the address signal.

Regarding the first or alternatively the second aspect of the invention, the substitution memory cells within the substitution memory block are advantageously less dense packed compared to the memory cells within the main memory block, i.e. larger substitution memory cells in comparison to the memory cells of the main memory are used, resulting in an increased yield regarding the substitution memory block. Thus, the design rules of a semiconductor technology, which limit the physical dimensions on the lower end, can be followed within the substitution memory block. Layout waivers, which break these rules in favor of a denser layout and which are critical for the fabrication of the memory circuit, are not necessary for the substitution memory block. Furthermore, the increased physical dimensions of the substitution memory cells enable flexible usage of the substitution memory block for process technologies with smaller as well as larger feature sizes.

It should be noted that the inventive memory circuit might also support a bitline-related or port-related repair approach according to the first aspect of the invention as well as a wordline-related (and optional also a word-related) repair approach according to the second aspect of the invention.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 1 shows a basic illustration of an inventive RAM circuit based on the inventive external bitline-related repair approach;

FIG. 2 shows a basic illustration of an inventive RAM circuit based on the inventive external wordline-related repair approach in combination with the word-related repair approach;

FIG. 3 shows a basic illustration of an inventive RAM circuit with multiple main memory arrays based on multiple repair approaches;

DETAILED DESCRIPTION OF THE PREFERRED EMBODIMENT

Figure 4:
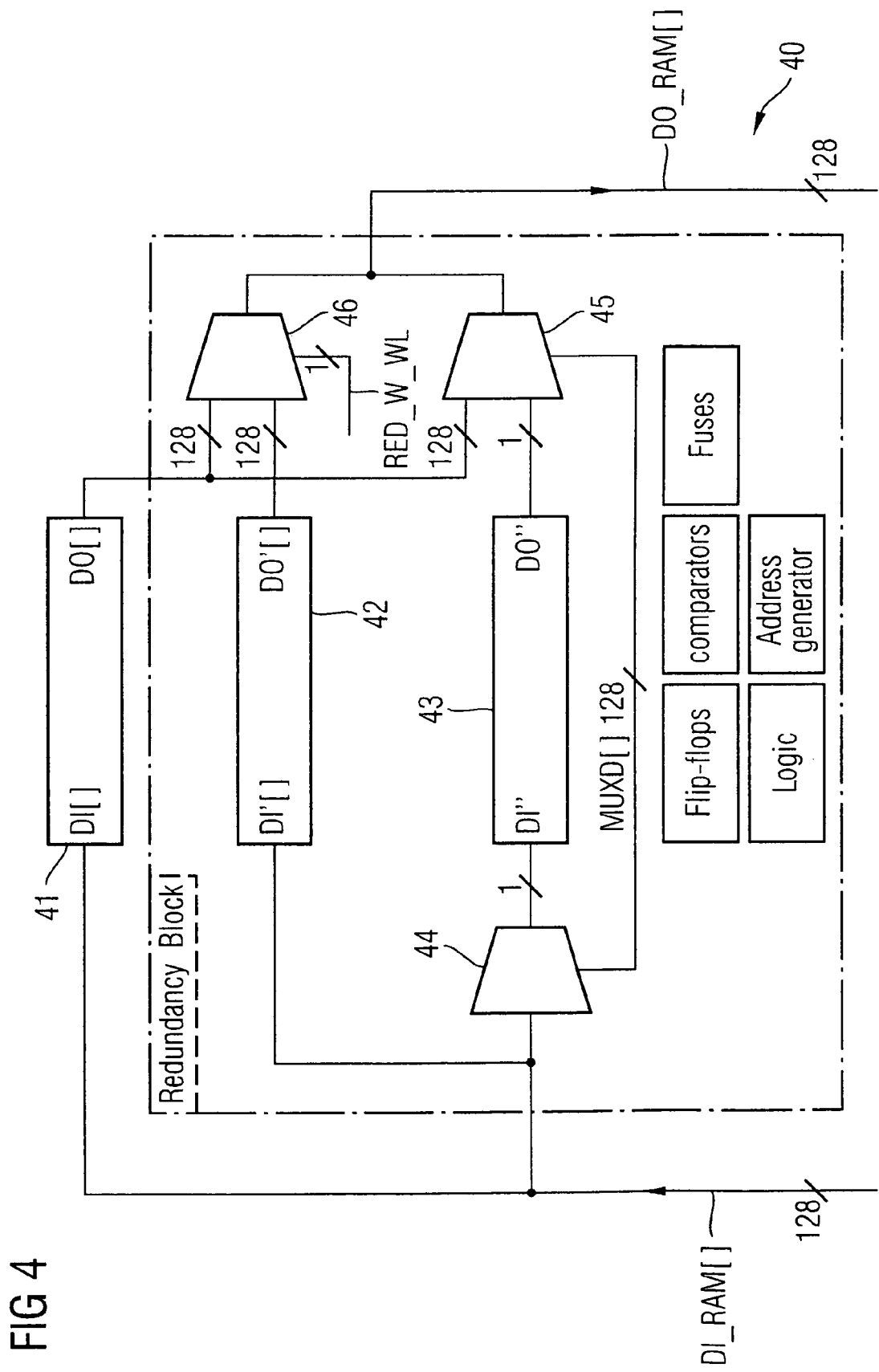
FIG. 4 shows a simplified block diagram of an implemented inventive RAM circuit.

FIG. 1 gives a basic illustration of an inventive RAM circuit based on the inventive external bitline-related repair approach. The memory cells 2 of a memory array 1 within a RAM circuit are arranged into y (e.g. 512) rows and x (e.g. 512) columns; the memory array 1 comprises a number of x*y memory cells 2. A plurality of x memory cells 2 within one row are assigned to one wordline (not shown), whereas a plurality of y memory cells 2 within one column are assigned to one bitline (not shown).

The memory array 1 is word-wise accessed, i.e. it comprises an n-bit-wide input and output (e.g. n=128) with n ports DI[0], DI[1], . . . DI[n−1] and DO[0], DO[1], . . . DO[n−1], respectively. To each input or output port a plurality of x/n bitlines is assigned. The selection of one bitline for each plurality of x/n bitlines is carried out by column multiplexers (not shown).

In case one or more memory cells within a particular bitline-related set 3 of memory cells 2 are defective, the whole particular bitline-related set 3 of memory cells 2 is substituted by memory cells 3' within a substitution memory 4, which comprises at least y memory cells. In FIG. 1 a memory array 4 of 8*(y/8) memory cells 3' is used for the substitution of y memory cells within a particular bitline-related set 3 of memory cells 2.

A substantial feature of the inventive RAM circuit is that the substitution memory array 4 is external to the main memory array 1, i.e. the substitution memory array 4 is placed outside the main memory array 1.

Since during a random word-wise read or write access of the main memory array 1 only one port DI[0], DI[1], . . . , DI[n−1] or DO[0], DO[1], . . . , DO[n−1] is affected by the memory substitution, the substitution memory array 4 is accessed via an 1-bit-wide input or output. The signal on the 1-bit-wide input or output substitutes the signal on the affected port DI[0], DI[1], . . . , DI[n−1] or DO[0], DO[1], . . . , DO[n−1].

For a port-related repair approach (not shown), which means that not only one particular bitline-related set 3 of memory cells 2 but all x/n (here: 4) bitline-related sets of memory cells 2 which are assigned to one port DI[i] or DO[i] (e.g. DI[0], DO[0]) are substituted, the number of memory cells within the substitution memory array 4 has to be increased to y*(x/n).

FIG. 2 shows a basic illustration of an inventive RAM circuit based on the inventive external wordline-related repair approach in combination with the word-related repair approach. Figurative elements of FIG. 1 and FIG. 2 which are related to the same reference signs are basically same.

In case one or more memory cells within a particular wordline-related set 5 of memory cells 2 are defective, the whole particular wordline-related set 5 of memory cells 2 is substituted by memory cells 5' within a substitution memory array 6, which comprises at least x memory cells. The substitution memory array 6 is external to the main memory array 1. The substitution memory array 6 is accessed via an n-bit-wide input and output (e.g. n=128) with n ports DI'[0], DI'[1], . . . , DI'[n−1] and DO'[0], DO'[1], . . . , DO'[n−1]. To each input port DI'[0], DI'[1], . . . , DI'[n−1] or output port DO'[0], DO'[1], . . . , DO'[n−1] a plurality of x'/n bitlines is assigned (x'=number of columns of the substitution memory array 6).

The number x of memory cells per row in the main memory array 1 and the number x' of memory cells per row in the substitution memory array 6 may be different. Advantageously, the ratio x/x' is an integer. In FIG. 2 the number x' is half the number x. Therefore, in FIG. 2 two rows within the substitution memory array 6 are used for the substitution of one row within the main memory array 1.

In addition, also word-related sets 7 of memory cells 2 and not solely complete wordline-related sets of memory cells 2 can be substituted by memory cells 7' within the substitution memory array 6.

FIG. 3 shows a basic illustration of an inventive RAM circuit with multiple main memory arrays based on multiple repair approaches. A main memory block 10 comprises a plurality (here: 3) of memory arrays 11, 12, 13. To each input port DI[0], DI[1], . . . , DI[n−1] or output port DO[0], DO[1], . . . , DO[n−1] of the main memory block 10 a number of x/n bitlines per memory array 11, 12, 13 is assigned.

The RAM circuit also comprises a substitution memory 14 which contains two memory blocks 16 and 17. The bitline-related memory block 16 is provided for the substitution of a first 18 and a second 19 bitline-related set of memory cells. Since the memory block 16 is capable to substitute two bitline-related sets of memory cells, the memory block 16 comprises for the data input and the data output each two ports DI"[0], DI"[1] and DO"[0], DO"[1], respectively. In addition, a wordline/word-related memory array 17 is provided for the substitution of a wordline-related set 20 of memory cells and for the substitution of a word-related set 21 of memory cells according to the explanations regarding FIG. 2.

FIG. 4 shows a simplified block diagram of an implemented inventive RAM circuit 40, which is an embedded SRAM circuit. The RAM circuit supports a wordline-related, a word-related and a bitline-related repair approach.

The RAM circuit 40 comprises a main memory block 41, a wordline/word-related substitution memory block 42 for wordline/word-related substitution of defective memory cells within the main memory block 41 and a bitline-related substitution memory block 43 for bitline-related substitution of defective memory cells within the main memory block 41. The RAM circuit 40 has an 128-bit-wide data input DI_RAM[ ] and an 128-bit-wide data output DO_RAM[ ] (n=128). The indication "[ ]" denotes that the particular signal, input or output comprises several bits.

Depending on the address signal (not shown), data has to be read or written in the main memory block 41 or in the substitution memory blocks 42 or 43. For the control of the data flow a plurality of multiplexers is employed.

For the data flow regarding the bitline-related memory substitution two multiplexers 44 and 45 are provided. During write access the 128-to-1 multiplexer 44 selects one affected bitline of the 128 bitlines of the input DI_RAM[ ] in case an addressed memory cell within the main memory block 41 is substituted. The output signal of the multiplexer 44 is fed to the data input DI" of the bitline-related substitution memory block 43. During read access the 129-to-128 multiplexer 45 (implemented by a plurality of 128 2-to-1 multiplexers) is used to deselect one bitline of the 128 bitlines of the data output DO[ ] of the main memory block and to substitute the deselected bitline with the data output DO" of the bitline-related substitution memory block 43 in case an addressed memory cell within the main memory block 41 is substituted. The output of the multiplexer is connected to the data output DO_RAM[ ] of the RAM circuit. Both multiplexers 44 and 45 are controlled via an 128-bit-wide select signal MUXD[ ]. Only the bit of the signal MUXD[ ] which corresponds to a substituted bit of the signal DI_RAM[ ] or DO_RAM[ ] is high, whereas the remaining 127 bits are low.

For the data flow regarding the wordline-related or word-related memory substitution a 256-to-128 multiplexer 46 (implemented by a plurality of 128 2-to-1 multiplexers) is provided. During read access the multiplexer 46 selects either the 128-bit-wide signal at the output DO[ ] of the main memory block 41 or the 128-bit-wide signal at the output DO'[ ] of the wordline/word-related substitution memory block 42 and feeds the selected signal to the output DO_RAM[ ] of the RAM circuit 40. The multiplexer 46 is controlled by an 1-bit-wide select signal RED_W_WL. For the data input, i.e. the write access, no particular multiplexer is necessary because the wordline/word-related substitution memory block 42 is disabled in case the current address is not affected by wordline/word-related mem-ory substitution.

In addition, a plurality of flip-flops, several comparators, several fuses, an address generator and additional logic gates are provided for memory substitution, the functions of which will be explained later on.

Figures 5, 5A:
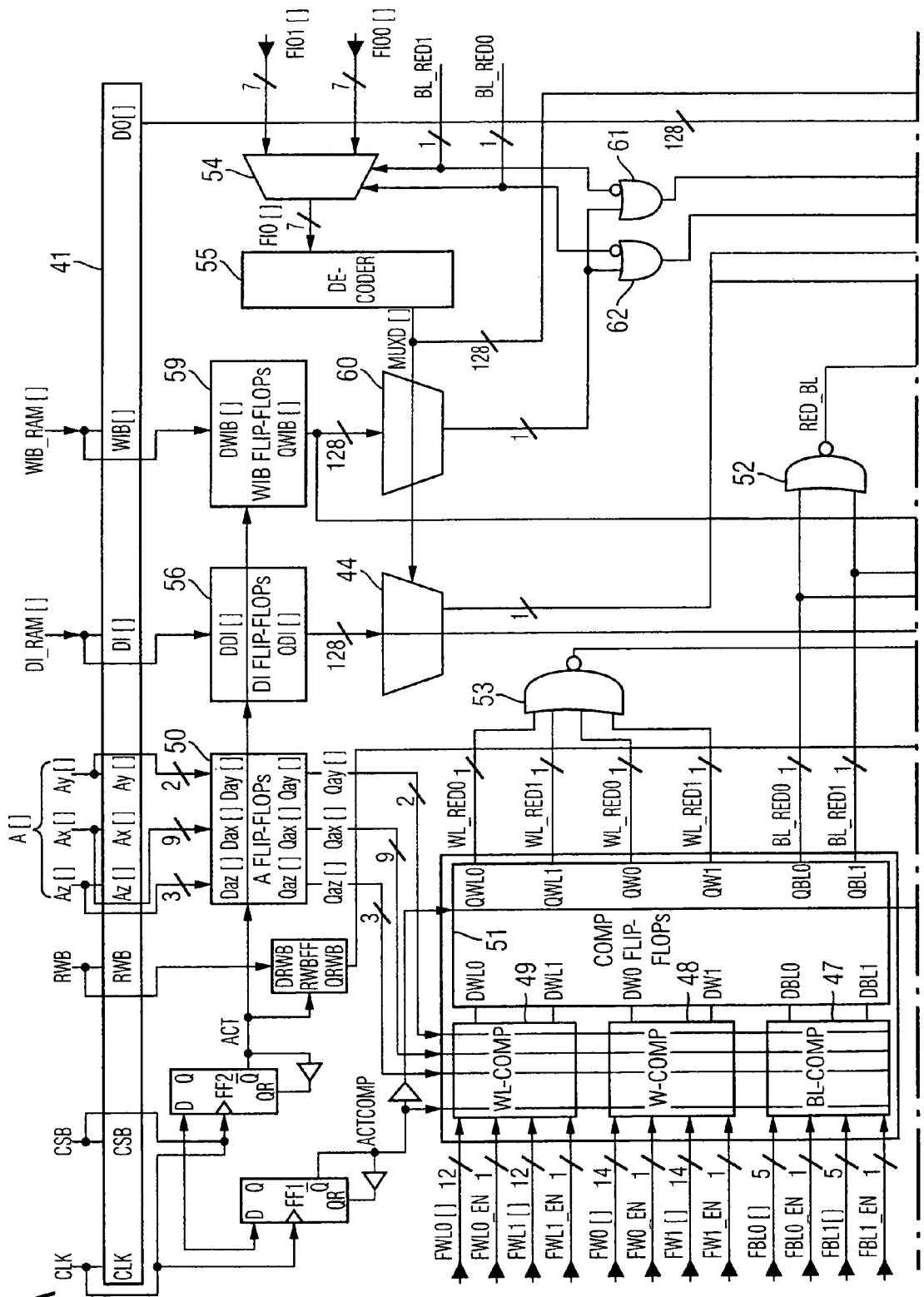
FIG. 5 shows a detailed block diagram of the implemented inventive RAM circuit.
Figure 5B:
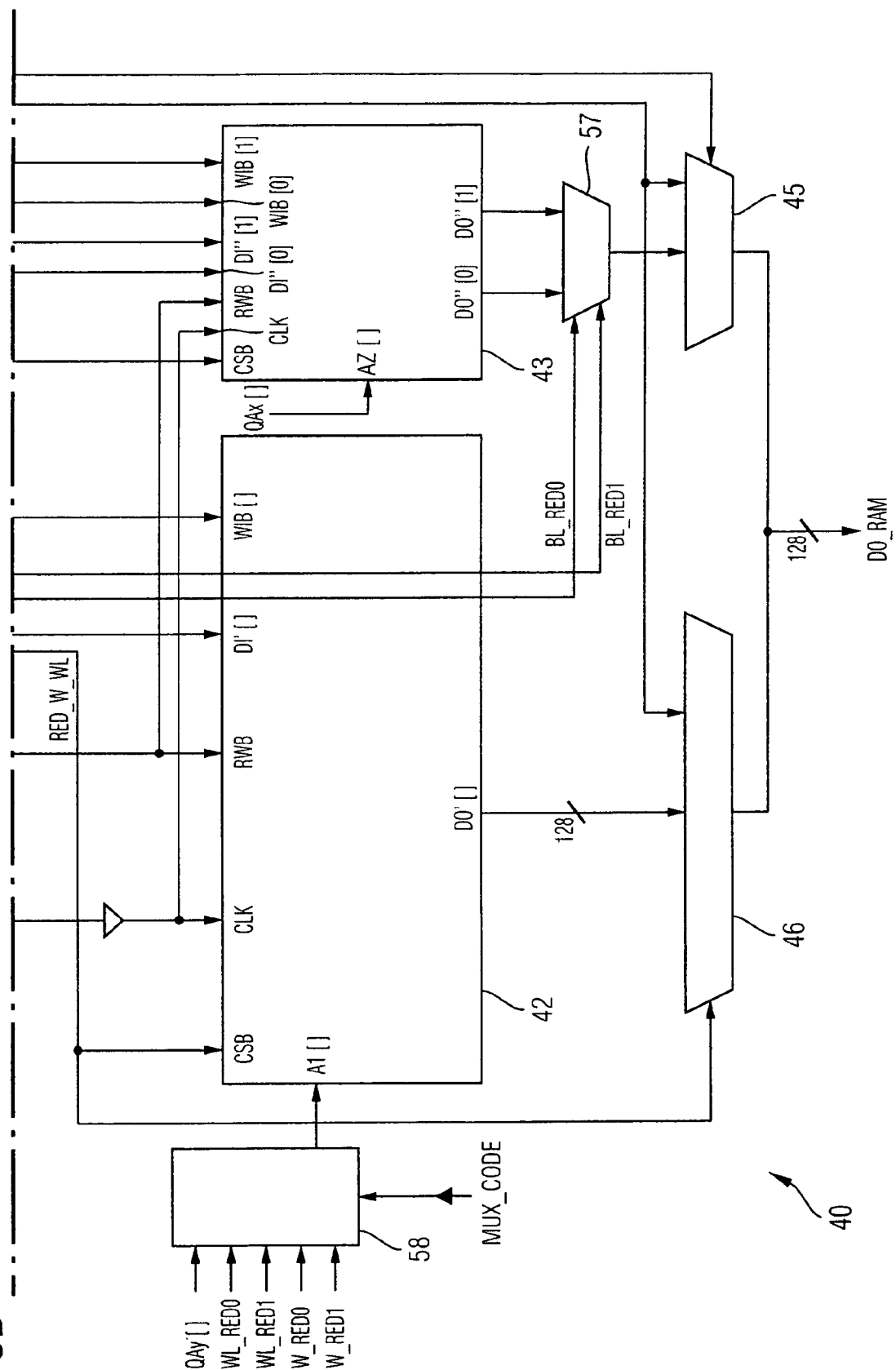

FIG. 5 shows a detailed block diagram of the implemented inventive RAM circuit according to FIG. 4. Figurative elements of FIG. 4 and FIG. 5 which are related to the same reference signs are basically same. Circuit elements which are exclusively assigned to wordline-related and word-related memory substitution are marked by dotted areas. In case these circuit elements are omitted the RAM circuit does not support word-line/word-related memory substitution but only bitline-related memory substitution.

The main memory block 41 comprises multiple memory arrays similar to the main memory block 12 according to FIG. 3. Here the main memory block 41 contains 8 memory arrays, with a particular memory array being addressed by a 3-bit-wide address signal component Az[ ] of the address signal A[ ]. Each memory array of the main memory block 41 contains y=512 wordlines. A particular wordline is selected by a 9-bit-wide address signal component Ax[ ]. The data busses DI[ ], DI_RAM[ ], DO[ ] and DO_RAM[ ] are, as mentioned earlier, 128-bit-wide (n=128). A plurality of 4 bitlines per memory array is assigned to each port of the data input DI[ ] or data out-put DO[ ], i.e. each column multiplexer is connected to 4 bitlines. One particular bitline out of the 4 bitlines is selected by a 2-bit-wide address signal component Ay[ ].

The operation mode, i.e. read or write access, is selected via the signal RWB (read write bar). The system clock is provided by the signal CLK. The main memory block is enabled by the chip-select signal CSB. Table 1 provides the truth table of the main memory block 41.

TABLE 1

| | CLK | CSB | RWB | WIB[i] | A[i] | DI[i] | DO[i] |
|---|---|---|---|---|---|---|---|
| read | low->high | low | high | low/high | address | low/high | data out |
| write | low->high | low | low | low | address | data in | old data out |
| disabled | low->high | high | low/high | low/high | low/high | low/high | old data out |

In addition, the main memory block supports writing of individual bits via a low-active 128-bit-wide signal WIB_RAM[ ] (write individual bar), i.e. the write operation for each bit of an addressed word can be individually enabled or disabled. In case a particular bit WIB_RAM[i] of the signal WIB_RAM[ ] is high, the corresponding bit of the data input DI[i] is not written in the memory. The information of the signal WIB_RAM[ ] is also considered in case one of the substitution memory blocks 42 or 43 is accessed. Before feeding the signal WIB_RAM[ ] to the substitution memory block 42 or 43, the signal WIB_RAM[ ] is sampled via the parallel flip-flops 59. The sampled version of the signal WIB_RAM[ ] is fed to the input WIB[ ] of the substitution memory block 42. In addition, for bitline-related memory substitution an 128-to-1 multiplexer 60 is provided which selects in dependency of the signal MUXD[ ] that particular bit of the sampled version of the signal WIB_RAM[ ] which corresponds to the substituted bit of the signal DI_RAM[ ].

The RAM circuit 40 according to FIG. 5 is capable to substitute 2 word-related sets, 2 wordline-related sets and 2 bitline-related sets of memory cells within the main memory block 41. For identifying the substituted memory cells address information of the substituted memory cells is stored (after memory test) within memory elements (not shown), particularly non-volatile memory elements. The stored address information is compared with address information which is derived from the address signal A[ ].

For specifying the two substituted word-related sets of memory cells two 14-bit-wide codes FW0[ ] and FW1[ ] are employed. These particular address codes FW0[ ] and FW1[ ] are compared with the current address signal A[ ], i.e. with all components Az[ ], Ax[ ] and Ay[ ] of the current address signal A[ ].

Regarding the wordline-related memory repair, for specifying the two substituted wordline-related sets of memory cells two 12-bit-wide codes FWL0[ ] and FWL1[ ] are employed; the codes FWL0[ ] and FWL1[ ] each specify the particular memory array (which corresponds to Az[ ]) and the particular wordline (which corresponds to Ax[ ]). The codes FWL0[ ] and FWL1[ ] are compared with the components Az[ ] and Ax[ ] of the current address signal A[ ].

Regarding the bitline-related memory repair, for specifying the two substituted bitline-related sets of memory cells two 5-bit-wide codes FBL0[ ] and FBL1[ ] amongst other information are employed. The codes FBL0[ ] and FBL1[ ] each specify the particular memory array (which corresponds to Az[ ]) and one bitline-related set of memory cells out of 4 bitline-related sets of memory cells for each port of the data input DI[ ] or data output DO[ ] (which corresponds to Ay[ ]). The codes FBL0[ ] and FBL1[ ] are compared with the components Az[ ] and Ay[ ] of the current address signal A[ ]. In addition, for further specification of the two bitline-related sets of memory cells two 7-bit-wide (Id(n)=Id(128) =7) codes FIO0[ ] and FIO1[ ] codes are employed which indicate the particular input or out-put port of the substituted bitline-related sets of memory cells. The codes FIO0[ ] and FIO1[ ] are read out of memory elements (not shown), particularly non-volatile memory elements.

Further, 1-bit-wide enable signals FBL0_EN, FBL1_EN, FW0_EN, FW1_EN, FWL0_EN and FWL1_EN are provided which indicate whether the corresponding redundancy memory resource is used or not. The enable signals FBL0_EN and FBL1_EN indicate whether a first and a second bitline-related set of memory cells are substituted or not. The enable signals FW0_EN and FW1_EN indicate whether a first and a second word-related set of memory cells are substituted or not. Finally, the enable signals FWL0_EN and FWL1_EN indicate whether a first and a second wordline-related set of memory cells are substituted or not. The signals FBL0_EN, FBL1_EN, FW0_EN, FW1_EN, FWL0_EN and FWL1_EN are read out of memory elements (not shown), particularly non-volatile memory elements.

For comparing the stored address information FW0[ ], FW1[ ], FWL0[ ], FWL1[ ], FBL0[ ] and FBL1[ ] with corresponding information which is derived from the actual address signal A[ ] address comparators 47, 48 and 49 are provided.

The flip-flop FF1 generates an activation pulse within the signal ACTCOMP (ACTCOMP is active high) that controls the operation of the address comparators 47, 48 and 49 and the comparator flip-flops 51.

The flip-flop FF2 generates an activation pulse within the signal ACT (ACT is active high) that controls the operation of the flip-flop RWBFF, the address flip-flops 50, the data input flip-flops 56 and the flip-flops 59 at the input WIB_RAM[ ]. The flip-flop RWBFF, the address flip-flops 50, the data input flip-flops 56 and the flip-flops 59 at the input WIB_RAM[ ] are used to sample the signals RWB, A[ ], DI[ ] and WIB[ ], respectively, at the rising edge of the clock signal. Thus, the sampled values of these signals are stored during the following clock cycle.

The two bitline-related address comparators 47 compare the stored codes FBL0[ ] and FBL1[ ] with sampled versions QAz[ ] and QAy[ ] of the components Az[ ] and Ay[ ] of the current address signal A[ ]. The sampled versions QAz[ ], QAx[ ] and QAy[ ] of the address components Az[ ], Ax[ ] and Ay[ ] are generated by a plurality of flip-flops 50. Each of the two comparisons is performed in case the corresponding enable signal FBL0_EN or FBL1_EN, respectively, is set to high.

The two word-related address comparators 48 compare the stored codes FW0[ ] and FW1[ ] with the sampled versions QAz[ ], Qax[ ], QAy[ ] of the components Az[ ], Ax[ ] and Ay[ ] of the current address signal A[ ]. Each of the two comparisons is performed in case the corresponding enable signal FW0_EN or FW1_EN, respectively, is set to high.

Finally, the two wordline-related address comparators 49 compare the stored codes FWL0[ ] and FWL1[ ] with the sampled versions QAz[ ] and Qax[ ] of the components Az[ ] and Ax[ ] of the current address signal A[ ]. Each of the two comparisons is performed in case the corresponding enable signal FWL0_EN or FWL1_EN, respectively, is set to high.

The output signals of the comparators 47, 48 and 49 are sampled by a plurality of parallel flip-flops 51.

The first and second output signal BL_RED0 and BL_RED1 of the flip-flops 51, which are active high, control the activation of the first and second bitline-related memory substitution.

The third and fourth output signal W_RED0 and W_RED1 (active high) of the flip-flops 51 control the activation of the first and second word-related memory substitution.

The fifth and sixth output signal WL_RED0 and WL_RED1 (active high) of the flip-flops 51 control the activation of the first and second word-line-related memory substitution.

The bitline-related signals BL_RED0 and BL_RED1 are fed to a NOR-gate 52, the output signal RED_BL (active low) of which indicates whether at least one bitline-related set of memory cells is substituted or not.

Analogously, the word-related signals W_RED0 and W_RED1 and wordline-related signals WL_RED0 and WL_RED1 are fed to a NOR-gate 53 with 4 in-puts, the output signal RED_W_WL (active low) of which indicates whether at least one wordline-related or word-related set of memory cells is substituted or not.

In case none of the comparators 47, 48 and 49 produce an active output signal, i.e. no failing address is accessed, none of the substitution memory blocks 42 and 43 is accessed, merely the main memory block 41 is accessed.

The subsequent description is related to the substitution of bitline-related sets of memory cells.

In case the signal RED_BL is active, i.e. is set to low level, the bitline-related substitution memory block 43 is enabled via its input CSB (chip-select bar).

In dependency of the signals BL_RED0 and BL_RED1, the corresponding 7-bit-wide code FIO0[ ] or FIO1[ ] of the first or the second bitline-related set of memory cells is selected by a multiplexer 54. The multiplexer 54 is formed by Id(n)=Id(128)=7 separate 2-to-1 multiplexers.

The selected code FIO[ ] is decoded via a decoder 55 to the above-mentioned 128-bit-wide signal MUXD[ ], with the bit-width of the signal MUXD[ ] corresponding to the number of ports of the data input/output of the RAM circuit. The signal MUXD[ ] indicates which of the n=128 parallel ports of the input or the output of the RAM circuit is affected by the bitline-related memory substitution.

As mentioned above the signal MUXD[ ] controls the multiplexers 44 and 45 for write and read memory access, respectively.

In case of a write operation which is affected by a bitline-related memory substitution (signal RED_BL is low and each port RWB of memory block 41 and 43 is low), one bit of the sampled version of the signal at the data input DI_RAM[ ] (sampling performed via parallel flip-flops 56) is written to the bitline-related substitution memory block 43 via the multiplexer 44. In parallel, the complete word at the data input DI_RAM[ ] is written in the main memory.

More specifically, the selected bit is first of all fed to both input ports DI"[0] and DI"[1] of the bitline-related substitution memory block 43, with each input port DI"[0] and DI"[1] being dedicated to one bitline-related set of memory cells to substitute (similar to memory block 16 in FIG. 3). The selection whether the first input port DI"[0] or the second input port DI"[1] is actually used is controlled via the state of the inputs WIB[0] and WIB[1], which work analogously to the input WIB[ ] of the main memory 41. In case of a logical low level at the inputs WIB[0] or WIB[1] the data signal at the output of the multiplexer 44 is written into the corresponding memory cells within the memory block 43. The state of the inputs WIB[0] and WIB[1] is controlled via the OR-gates 61, 62 in dependency of the signals BL_RED0 and BL_RED1, respectively, and also in dependency of the output signal of the multiplexer 60.

In case of a read operation which is affected by a bitline-related memory substitution (signal RED_BL is low and each port RWB of memory block 41 and 43 is high), one of the two data output ports DO"[0] and DO"[1] is selected via the 2-to-1 multiplexer 57, with each output port DO"[0] and DO"[1] being dedicated to one substituted bitline-related set of memory cells. The selection of the multiplexer 57 is controlled by the signals BL_RED0 and BL_RED1: in case BL_RED0 is high, the port DO"[0] is selected; in case BL_RED1 is high, the port DO"[1] is selected.

The 129-to-128 multiplexer 45, which drives the global data output bus DO_RAM[ ], deselects one bitline of the 128 bitlines of the data output DO[ ] of the main memory block 41 and substitutes the signal on the deselected bitline with the signal on the data output of the multiplexer 57.

Regarding the addressing of the bitline-related substitution memory block 43, the number of addresses of the memory block 43 is equal to the number y of memory cells within one bitline-related set of memory cells of the main memory block 41. Here y=512 memory cells are connected to one bitline; consequently, the memory block 43 has 512 addresses. The address input A2[ ] of the memory block 43 is driven by the sampled version QAx[ ] of the address component Ax[ ] which specifies the current wordline and has 512 different values.

The subsequent description is related to the substitution of wordline- or word-related sets of memory cells.

In case the signal RED_W_WL is active, i.e. is set to low level, the word/wordline-related substitution memory block 42 is enabled via its input CSB (chip-select bar).

The word/wordline-related substitution memory block 42 offers the same number of ports at the data input DI'[ ] and the data output DO'[ ] than the main memory block 41. The number of addresses of the word/wordline-related substitution memory block 42 is reduced compared to the number of addresses of the main memory block 41. In addition, the main memory block 41 and the word/wordline-related substitution memory block 42 may have a different number x/n of bitlines which are assigned to one column multiplexer (e.g. 4 bitlines in memory block 41 and 2 bitlines in memory block 42).

Consequently, an address generator 58 is employed which generates an appropriate address signal for driving the address input A1[ ] of the memory block 42. The address generator 58 can be also regarded as an address converter which modifies a particular main memory address signal A[ ] or a subset thereof to an appropriate address signal for driving the address input A1[ ] of the memory block 42. The address generator 58 is controlled by the sampled version QAy[ ] of the address component Ay[ ] and the signals W_RED0, W_RED1, WL_RED0 and WL_RED1. In addition, the address generator 58 is configurable, i.e. it supports different designs of the main memory block 41 with different widths x/n of the column multiplexers in the main memory block 41. The actual width x/n is configured by the signal MUX_CODE.

In case of a write operation which is affected by a wordline/word-related memory substitution (signal RED_W_WL is low and each port RWB of memory block 41 and 42 is low), the sampled version of signal at the data input DI_RAM[ ] is written to the memory block 42, which is enabled before via the port CSB.

In case of a read operation which is affected by a wordline/word-related memory substitution (signal RED_W_WL is low and each port RWB of memory block 41 and 42 is high), the data at the output DO'[ ] of the memory block 42 is selected via the multiplexer 46 and fed to the global data output bus DO_RAM[ ].

To support a port-related repair approach instead of a simple bitline-related repair approach, the RAM circuit 40 has to be modified in the following way:

1. The bit-width of the codes FBL0[ ] and FBL1[ ] has to be reduced from 5 to 3 since the 2-bit-wide information Ay[ ] that codes the bitline-index within each plurality of x/n bitlines is not relevant for the comparison. The comparators 47 compare the reduced codes FBL0[ ] and FBL1[ ] only with the sampled version QAz[ ] of the address component Az[ ]. Consequently, the number of memory cells for storing each of these codes is reduced to 3.

2. The bitline-related substitution memory block 43 has a x/n times higher number of addresses to be able to substitute all memory cells which are connected to one column multiplexer. Consequently, the address input A2[ ] of the memory is in addition fed by the signal QAy[ ].

It should be noted that the particular choice of the parameters of the inventive RAM circuit 40, e.g. the number x of bitlines (here 512), the number y of wordlines (here 512), the number n of I/O-ports (here 128) or the number of memory arrays within the main memory block 41 (here 8), is arbitrary. The inventive RAM circuit 40 can also be implemented with a different choice of such parameters.

Although the RAM circuit 40 according to FIG. 5 merely supports memory substitution of one single independent main memory block 41, the invention is not limited to memory substitution of a single independent main memory block. Thus, it is conceivable to substitute two or more independent main memory blocks. In this case, these main memory blocks share the resources for memory substitution, in particular the substitution memory blocks. In order to provide this option, the access to the substitution memory blocks is preferably redirected according to the particular main memory block which uses the substitution memory blocks for a given clock cycle. In this case, a set of redirections means is provided which redirects the address information, the signal RWB, the data input and the data output between the substitution memory blocks and the different main memory blocks.

In addition, it should be noted that the invention is not limited to main memory blocks with one data input and one data output. It is included within the scope of the invention to employ main memory blocks with several data inputs and several data inputs. In this case, the substitution memory blocks preferably have the same number of data inputs and data outputs as the main memory block. In addition, specific redirection means for the various data inputs and data outputs are provided.

Finally, the inventive idea is not strictly limited to the substitution of a complete bitline-related, port-related or wordline-related set of memory cells. It is conceivable that the substitution memory block is arranged to substitute a part of a bitline-related, port-related or word-line-related set of memory cells, e.g. one fourth of a bitline-related set of memory cells.

While the foregoing is directed to embodiments of the present invention, other and further embodiments of the invention may be devised without departing from the basic scope thereof, and the scope thereof is determined by the claims that follow.

What is claimed is:

1. A memory circuit having a data input and a data out-put, comprising:
    a main memory block having a data input and a data output and comprising at least one complete memory array of memory cells being connected to wordlines and bitlines, with the memory cells being addressable via an address signal;
    a substitution memory block for the substitution of memory cells within the main memory block, having at least one data input and at least one data output and comprising a plurality of substitution memory cells; wherein the substitution memory block is external to the main memory block and arranged to substitute at least one bitline-related set of memory cells being connected to the same bitline in one memory array of the main memory block; and
    a redirection circuit for redirecting access to a memory cell of the at least one respective substituted bitline-related set of memory cells in the main memory block to the substitution memory block, wherein the redirection circuit comprises:
        a first multiplexer having (i) an input electrically connected to receive a signal from the data input of the memory circuit and (ii) an output electrically connected to the data input of the substitution memory block; whereby the first multiplexer is configured to support writing to the substitution memory block; and
        a second multiplexer having (iii) an input electrically connected to receive a signal from the at least one data output of the substitution memory block and a signal from the data output of the main memory block and (iv) an output electrically connected to the data output of the memory circuit; whereby the second multiplexer is configured to support reading from the substitution memory block.

2. The memory circuit of claim 1, wherein the data input and the data output of the memory circuit and the data input and the data output of the main memory block are each n-bit-wide and each comprise n ports, with n>1.

3. The memory circuit of claim 2, wherein the substitution memory block is arranged to substitute at least one port-related set of memory cells within one memory array, with the at least one port-related set of memory cells comprises those bitline-related sets of memory cells within one memory array being assigned to the same port of the data input and data output of the main memory block and wherein the redirection circuit is arranged to redirect the access to a memory cell of the at least one substituted port-related set of memory cells to the substitution memory block.

4. The memory circuit of claim 3, wherein the redirection circuit comprises:
    a storage element for storing at least one third code specifying the at least one respective substituted port-related set of memory cells; and
    a second comparator, which compares the at least one stored third code with a code derived from the address signal.

5. The memory circuit of claim 4, wherein the substitution memory block comprises a chip-select input, which enables the substitution memory block, with the signal at the chip-select input being dependent on a signal at the output of the second comparator.

6. The memory circuit of claim 5, wherein the main memory block comprises a plurality of complete memory arrays and the third code specifies a particular memory array in which the at least one respective substituted port-related set of memory cells is located.

7. The memory circuit of claim 3, wherein the redirection circuit comprises:
    a storage element for storing a fourth code specifying the port-index of any of the n-bit-wide data inputs and/or data outputs and which are related to the at least one respective substituted port-related set of memory cells, wherein the fourth code is Id(n)-bit-wide; and
    a decoder for decoding the fourth code to a select signal controlling any above-specified multiplexer, particularly the select signal being an n-bit-wide signal.

8. The memory circuit of claim 3, wherein the substitution memory cells within the substitution memory block are less densely packed compared to the memory cells within the main memory block.

9. The memory circuit of claim 1, wherein the at least one data input and the at least one data output of the substitution memory block are each 1-bit-wide.

10. The memory circuit of claim 1, wherein the data input and the data output of the memory circuit and the data input and the data output of the main memory block are each n-bit-wide and each comprise n ports, with n>1; wherein the at least one data input and the at least one data output of the substitution memory block are each 1-bit-wide; and wherein the first multiplexer is an n-to-1-multiplexer.

11. The memory circuit of claim 10, wherein the second multiplexer is an (n+1)-to-n-multiplexer.

12. The memory circuit of claim 1, wherein the redirection circuit comprises:
    a storage element for storing at least one first code specifying the at least one respective substituted bitline-related set of memory cells; and
    a first comparator configured to compare the at least one stored first code with a code being derived from the address signal.

13. The memory circuit of claim 12, wherein the substitution memory block comprises a chip-select input configured for enabling the substitution memory block, with the signal at the chip-select input being dependent on the signal at an output of the first comparator.

14. The memory circuit of claim 12, wherein:
    for each memory array of the main memory block, a plurality of bitline-related sets memory cells is assigned to each port of at least one of the data input and data output of the main memory block; and the at least one first code specifies one bitline-related set of memory cells within each of the plurality of bitline-related sets of memory cells.

15. The memory circuit of claim 12, wherein the main memory block comprises a plurality of complete memory arrays and the at least first code specifies at which of the plurality of complete memory arrays the at least one respective substituted bitline-related set of memory cells is located.

16. The memory circuit of claim 12, wherein the redirection circuit comprises:
a first multiplexer having (i) an input electrically connected to receive a signal from the data input of the memory circuit and (ii) an output electrically connected to the data input of the substitution memory block; whereby the first multiplexer is configured to support writing to the substitution memory block;
a second multiplexer having (i) an input electrically connected to receive a signal from the at least one data output of the substitution memory block and a signal from the data output of the main memory block and (ii) an output electrically connected to the data output of the memory circuit; whereby the second multiplexer is configured to support reading from the substitution memory block;
a storage element for storing a Id(n)-bit-wide code specifying a port-index of any of the data input and data output of the of the main memory block which are related to the at least one respective substituted bitline-related set of memory cells; and
a decoder for decoding the second code to a select signal controlling at least one of the first and second multiplexer, wherein the select signal is an n-bit-wide signal.

17. The memory circuit of claim 16, wherein the substitution memory block is arranged to substitute a plurality m of bitline-related sets of memory cells, wherein the substitution memory block comprises m 1-bit-wide data inputs and m 1-bit-wide data outputs; and the storage element for storing the first code is arranged to store m first codes of m substituted bitline-related sets of memory cells and wherein the redirection circuit comprises m first comparators which compare the m stored first codes with a code derived from the address signal.

18. A memory circuit having a data input and a data output, comprising:
a main memory block having a data input and a data output and comprising at least one complete memory array of memory cells being connected to wordlines and bitlines, with the memory cells being addressable via an address signal; a substitution memory block for the substitution of memory cells within the main memory block, having at least one data input and at least one data output and comprising a plurality of substitution memory cells; wherein the substitution memory block is external to the main memory block and arranged to substitute at least one wordline-related set of memory cells being connected to the same wordline in one memory array, and
a redirection circuit for redirecting access to a memory cell of the at least one respective substituted wordline-related set of memory cells in the main memory block to the substitution memory block, wherein the respective data input and the data output of the memory circuit, the main memory block and the substitution memory block are each n-bit-wide and each comprise n ports, with n>1.

19. The memory circuit of claim 18, wherein the redirection circuit comprises a multiplexer, an input of which is electrically connected to receive a signal on the data output of the substitution memory block and a signal on the data output of the main memory block, and an output of which is electrically connected to the data output of the memory circuit.

20. The memory circuit of claim 19, wherein the multiplexer is a 2n-to-n-multiplexer.

21. The memory circuit of claim 18, wherein the redirection circuit comprises:
a storage element for storing at least one code specifying the at least one respective substituted wordline-related set of memory cells; and
a first comparator, which compares the at least one stored code, with a code derived from the address signal.

22. The memory circuit of claim 21, wherein the substitution memory block comprises a chip-select input, which enables the substitution memory block, with the signal at the chip-select input being dependent on a signal at the output of the first comparator.

23. The memory circuit of claim 18, wherein the redirection circuit comprises an address generator, which drives an address input of the substitution memory block and which receives a code being derived from the address signal.

24. The memory circuit according to claim 23, wherein the address generator is configurable with respect to a number of bitlines within a given memory array of the main memory block which are assigned to a given port of the data input and/or data output of the main memory block.

25. The memory circuit of claim 18, wherein the substitution memory block is arranged to substitute at least one word-related set of memory cells in the main memory being addressed by one single address code of the address signal; and wherein the redirection circuit is also arranged to redirect the access to a memory cell of the at least one respective substituted word-related set of memory cells in the main memory block to the substitution memory block.

26. The memory circuit of claim 25, wherein the redirection circuit comprises:
a storage element for storing at least one address code of the at least one respective substituted word-related set of memory cells; and
a second comparator, which compares the at least one stored address code with the code of the address signal.

27. The memory circuit of claim 18, wherein the substitution memory cells within the substitution memory block are less densely packed compared to the memory cells within the main memory block.

28. The memory circuit of claim 18, wherein the memory circuit is a SRAM circuit.

29. A method, comprising:
for an access attempt, receiving an address signal addressing memory cells of a memory array and connected to wordlines and bitlines in a main memory block having a data input and a data output;
redirecting the access attempt to substitution memory cells of a substitution memory block predefined for the substitution of memory cells within the main memory block, the substitution memory block having at least one data input and at least one data output; wherein the substitution memory block is external to the main memory block and arranged to substitute at least one of:
a wordline-related set of memory cells being connected to the same word line in one memory array of the main memory block; and a bitline-related set of memory cells being connected to the same bitline in one memory array of the main memory blocks, wherein the respective data input and the data output of the main memory block and the substitution memory block are each n-bit-wide and each comprise n ports, with n>1.

30. The method of claim 29, wherein redirecting the access attempt is performed by a multiplexer.

31. A memory circuit having a data input and a data out-put, comprising:

a main memory block having a data input and a data output and comprising at least one complete memory array of memory cells being connected to wordlines and bitlines, with the memory cells being addressable via an address signal;

a substitution memory block for the substitution of memory cells within the main memory block, having at least one data input and at least one data output and comprising a plurality of substitution memory cells; wherein the substitution memory block is external to the main memory block and arranged to substitute at least one bitline-related set of memory cells being connected to the same bitline in one memory array of the main memory block; and a redirection circuit for redirecting access to a memory cell of the at least one respective substituted bitline-related set of memory cells in the main memory block to the substitution memory block, wherein the data input and the data output of the memory circuit and the data input and the data output of the main memory block are each n-bit-wide and each comprise n ports, with n>1.

32. A memory circuit having a data input and a data out-put, comprising:

a main memory block having a data input and a data output and comprising at least one complete memory array of memory cells being connected to wordlines and bitlines, with the memory cells being addressable via an address signal;

a substitution memory block for the substitution of memory cells within the main memory block, having at least one data input and at least one data output and comprising a plurality of substitution memory cells; wherein the substitution memory block is external to the main memory block and arranged to substitute at least one bitline-related set of memory cells being connected to the same bitline in one memory array of the main memory block; and a redirection circuit for redirecting access to a memory cell of the at least one respective substituted bitline-related set of memory cells in the main memory block to the substitution memory block, wherein the at least one data input and the at least one data output of the substitution memory block are each 1-bit-wide.

33. A memory circuit having a data input and a data output, comprising:

a main memory block having a data input and a data output and comprising at least one complete memory array of memory cells being connected to wordlines and bitlines, with the memory cells being addressable via an address signal;

a substitution memory block for the substitution of memory cells within the main memory block, having at least one data input and at least one data output and comprising a plurality of substitution memory cells; wherein the substitution memory block is external to the main memory block and arranged to substitute at least one wordline-related set of memory cells being connected to the same wordline in one memory array, and a redirection circuit for redirecting access to a memory cell of the at least one respective substituted wordline-related set of memory cells in the main memory block to the substitution memory block, wherein the substitution memory cells within the substitution memory block are less densely packed compared to the memory cells within the main memory block.

34. A memory circuit having a data input and a data out-put, comprising:

a main memory block having a data input and a data output and comprising at least one complete memory array of memory cells being connected to wordlines and bitlines, with the memory cells being addressable via an address signal;

a substitution memory block for the substitution of memory cells within the main memory block, having at least one data input and at least one data output and comprising a plurality of substitution memory cells; wherein the substitution memory block is external to the main memory block and arranged to substitute at least one bitline-related set of memory cells being connected to the same bitline in one memory array of the main memory block; and a redirection circuit for redirecting access to a memory cell of the at least one respective substituted bitline-related set of memory cells in the main memory block to the substitution memory block, wherein the redirection circuit comprises:

a storage element for storing at least one first code specifying the at least one respective substituted bitline-related set of memory cells; and a first comparator configured to compare the at least one stored first code with a code being derived from the address signal, wherein the substitution memory block comprises a chip-select input configured for enabling the substitution memory block, with the signal at the chip-select input being dependent on the signal at an output of the first comparator.

35. A memory circuit having a data input and a data out-put, comprising:

a main memory block having a data input and a data output and comprising at least one complete memory array of memory cells being connected to wordlines and bitlines, with the memory cells being addressable via an address signal;

a substitution memory block for the substitution of memory cells within the main memory block, having at least one data input and at least one data output and comprising a plurality of substitution memory cells; wherein the substitution memory block is external to the main memory block and arranged to substitute at least one bitline-related set of memory cells being connected to the same bitline in one memory array of the main memory block; and a redirection circuit for redirecting access to a memory cell of the at least one respective substituted bitline-related set of memory cells in the main memory block to the substitution memory block, wherein the redirection circuit comprises:

a storage element for storing at least one first code specifying the at least one respective substituted bitline-related set of memory cells; and a first comparator configured to compare the at least one stored first code with a code being derived from the address signal, wherein for each memory array of the main memory block, a plurality of bitline-related sets of memory cells are assigned to each port of at least one of the data input and data output of the main memory block and the at least one first code specifies one bitline-related set of memory cells within each of the plurality of bitline-related sets of memory cells.

36. A memory circuit having a data input and a data out-put, comprising:
   a main memory block having a data input and a data output and comprising at least one complete memory array of memory cells being connected to wordlines and bitlines, with the memory cells being addressable via an address signal;
   a substitution memory block for the substitution of memory cells within the main memory block, having at least one data input and at least one data output and comprising a plurality of substitution memory cells; wherein the substitution memory block is external to the main memory block and arranged to substitute at least one bitline-related set of memory cells being connected to the same bitline in one memory array of the main memory block; and
   a redirection circuit for redirecting access to a memory cell of the at least one respective substituted bitline-related set of memory cells in the main memory block to the substitution memory block, wherein the redirection circuit comprises:
      a storage element for storing at least one first code specifying the at least one respective substituted bitline-related set of memory cells; and
      a first comparator configured to compare the at least one stored first code with a code being derived from the address signal, wherein the main memory block comprises a plurality of complete memory arrays and the at least first code specifies the location of the at least one respective substituted bitline-related set of memory cells in the plurality of complete memory arrays.

37. A memory circuit having a data input and a data out-put, comprising:
   a main memory block having a data input and a data output and comprising at least one complete memory array of memory cells being connected to wordlines and bitlines, with the memory cells being addressable via an address signal;
   a substitution memory block for the substitution of memory cells within the main memory block, having at least one data input and at least one data output and comprising a plurality of substitution memory cells; wherein the substitution memory block is external to the main memory block and arranged to substitute at least one bitline-related set of memory cells being connected to the same bitline in one memory array of the main memory block; and
   a redirection circuit for redirecting access to a memory cell of the at least one respective substituted bitline-related set of memory cells in the main memory block to the substitution memory block, wherein the redirection circuit comprises:
      a storage element for storing at least one first code specifying the at least one respective substituted bitline-related set of memory cells; and
      a first comparator configured to compare the at least one stored first code with a code being derived from the address signal, wherein the redirection circuit comprises:
         a first multiplexer having (i) an input electrically connected to receive a signal from the data input of the memory circuit and (ii) an output electrically connected to the data input of the substitution memory block; whereby the first multiplexer is configured to support writing to the substitution memory block;
         a second multiplexer having (i) an input electrically connected to receive a signal from the at least one data output of the substitution memory block and a signal from the data output of the main memory block and (ii) an output electrically connected to the data output of the memory circuit; whereby the second multiplexer is configured to support reading from the substitution memory block;
         a storage element for storing a Id(n)-bit-wide code specifying a port-index of any of the data input and data output of the of the main memory block which are related to the at least one respective substituted bitline-related set of memory cells; and
         a decoder for decoding the second code to a select signal controlling at least one of the first and second multiplexer, wherein the select signal is an n-bit-wide signal.

38. A memory circuit having a data input and a data output, comprising:
   a main memory block having a data input and a data output and comprising at least one complete memory array of memory cells being connected to wordlines and bitlines, with the memory cells being addressable via an address signal;
   a substitution memory block for the substitution of memory cells within the main memory block, having at least one data input and at least one data output and comprising a plurality of substitution memory cells; wherein the substitution memory block is external to the main memory block and arranged to substitute at least one wordline-related set of memory cells being connected to the same wordline in one memory array, and
   a redirection circuit for redirecting access to a memory cell of the at least one respective substituted wordline-related set of memory cells in the main memory block to the substitution memory block, wherein the redirection circuit comprises:
      a storage element for storing at least one code specifying the at least one respective substituted wordline-related set of memory cells; and
      a first comparator, which compares the at least one stored code, with a code derived from the address signal, wherein the substitution memory block comprises a chip-select input, which enables the substitution memory block, with the signal at the chip-select input being dependent on a signal at the output of the first comparator.

39. A memory circuit having a data input and a data output, comprising:
   a main memory block having a data input and a data output and comprising at least one complete memory array of memory cells being connected to wordlines and bitlines, with the memory cells being addressable via an address signal;

a substitution memory block for the substitution of memory cells within the main memory block, having at least one data input and at least one data output and comprising a plurality of substitution memory cells; wherein the substitution memory block is external to the main memory block and arranged to substitute at least one wordline-related set of memory cells being connected to the same wordline in one memory array, and a redirection circuit for redirecting access to a memory cell of the at least one respective substituted wordline-related set of memory cells in the main memory block to the substitution memory block, wherein the redirection circuit comprises an address generator, which drives an address input of the substitution memory block and which receives a code being derived from the address signal, the address generator being configurable with respect to a number of bitlines within a given memory array of the main memory block which are assigned to a given port of the data input and/or data output of the main memory block.

40. A memory circuit having a data input and a data output, comprising:
- a main memory block having a data input and a data output and comprising at least one complete memory array of memory cells being connected to wordlines and bitlines, with the memory cells being addressable via an address signal;
- a substitution memory block for the substitution of memory cells within the main memory block, having at least one data input and at least one data output and comprising a plurality of substitution memory cells; wherein the substitution memory block is external to the main memory block and arranged to substitute at least one wordline-related set of memory cells being connected to the same wordline in one memory array, and
- a redirection circuit for redirecting access to a memory cell of the at least one respective substituted wordline-related set of memory cells in the main memory block to the substitution memory block, wherein the substitution memory block is arranged to substitute at least one word-related set of memory cells in the main memory being addressed by one single address code of the address signal; and wherein the redirection circuit is also arranged to redirect the access to a memory cell of the at least one respective substituted word-related set of memory cells in the main memory block to the substitution memory block.

* * * * *